US 9,153,674 B2

(12) United States Patent
Schulze

(10) Patent No.: US 9,153,674 B2
(45) Date of Patent: Oct. 6, 2015

(54) INSULATED GATE BIPOLAR TRANSISTOR

(75) Inventor: Hans-Joachim Schulze, Taufkirchen (DE)

(73) Assignee: Infineon Technologies Austria AG, Villach (AU)

( * ) Notice: Subject to any disclaimer, the term of this patent is extended or adjusted under 35 U.S.C. 154(b) by 93 days.

(21) Appl. No.: 12/421,322

(22) Filed: Apr. 9, 2009

(65) Prior Publication Data

US 2010/0258840 A1  Oct. 14, 2010

(51) Int. Cl.
*H01L 29/739* (2006.01)
*H01L 29/06* (2006.01)
*H01L 29/10* (2006.01)

(52) U.S. Cl.
CPC ........ *H01L 29/7395* (2013.01); *H01L 29/0696* (2013.01); *H01L 29/1095* (2013.01); *H01L 29/7393* (2013.01)

(58) Field of Classification Search
CPC ............ H01L 29/7393; H01L 21/8222; H01L 21/8248; H01L 21/8249; H01L 29/66272; H01L 29/66325; H01L 29/66333
USPC .......... 257/140, 146, 197, 337, 506, E29.027, 257/E29.066, E29.067, 139; 438/329, 379, 438/380
See application file for complete search history.

(56) References Cited

U.S. PATENT DOCUMENTS

| | | | | |
|---|---|---|---|---|
| 4,573,066 A | * | 2/1986 | Whight | 257/495 |
| 4,866,500 A | * | 9/1989 | Nishizawa et al. | 257/114 |
| 5,162,876 A | * | 11/1992 | Kitagawa et al. | 257/138 |
| 5,264,378 A | * | 11/1993 | Sakurai | 438/138 |
| 5,360,984 A | * | 11/1994 | Kirihata | 257/143 |
| 5,493,134 A | * | 2/1996 | Mehrotra et al. | 257/132 |
| 5,668,385 A | | 9/1997 | Bauer et al. | |
| 6,323,509 B1 | * | 11/2001 | Kusunoki | 257/146 |
| 6,326,648 B1 | * | 12/2001 | Jalade et al. | 257/130 |
| 6,417,542 B2 | * | 7/2002 | Werner | 257/335 |
| 6,552,413 B1 | * | 4/2003 | Hirano et al. | 257/603 |
| 6,605,830 B1 | * | 8/2003 | Kusunoki | 257/156 |
| 6,667,515 B2 | * | 12/2003 | Inoue | 257/341 |
| 7,456,484 B2 | * | 11/2008 | Ozeki et al. | 257/506 |
| 7,635,878 B2 | * | 12/2009 | Suekawa | 257/197 |
| 7,884,389 B2 | | 2/2011 | Schulze et al. | |
| 2002/0036488 A1 | * | 3/2002 | Ueda | 323/313 |
| 2005/0253169 A1 | * | 11/2005 | Suekawa | 257/197 |
| 2007/0215981 A1 | * | 9/2007 | Schulze et al. | 257/591 |
| 2008/0135871 A1 | * | 6/2008 | Ruething et al. | 257/139 |
| 2009/0114946 A1 | * | 5/2009 | Ueno | 257/137 |

FOREIGN PATENT DOCUMENTS

DE   10 2006 001 252   7/2007

OTHER PUBLICATIONS

"Improved Recovery of Fast Power Diodes with Self-Adjusting p Emitter Efficiency", Heinrich Schlangenotto, et al., IEEE 1989 (4 pgs.).

* cited by examiner

*Primary Examiner* — Thao X Le
*Assistant Examiner* — J. R. Oakley
(74) *Attorney, Agent, or Firm* — Dicke, Billig & Czaja, PLLC

(57) ABSTRACT

A semiconductor device is disclosed. One embodiment provides a cell area and a junction termination area at a first side of a semiconductor zone of a first conductivity type. At least one first region of a second conductivity type is formed at a second side of the semiconductor zone. The at least one first region is opposed to the cell area region. At least one second region of the second conductivity type is formed at the second side of the semiconductor zone. The at least one second region is opposed to the cell area region and has a lateral dimension smaller than the at least first region.

7 Claims, 5 Drawing Sheets

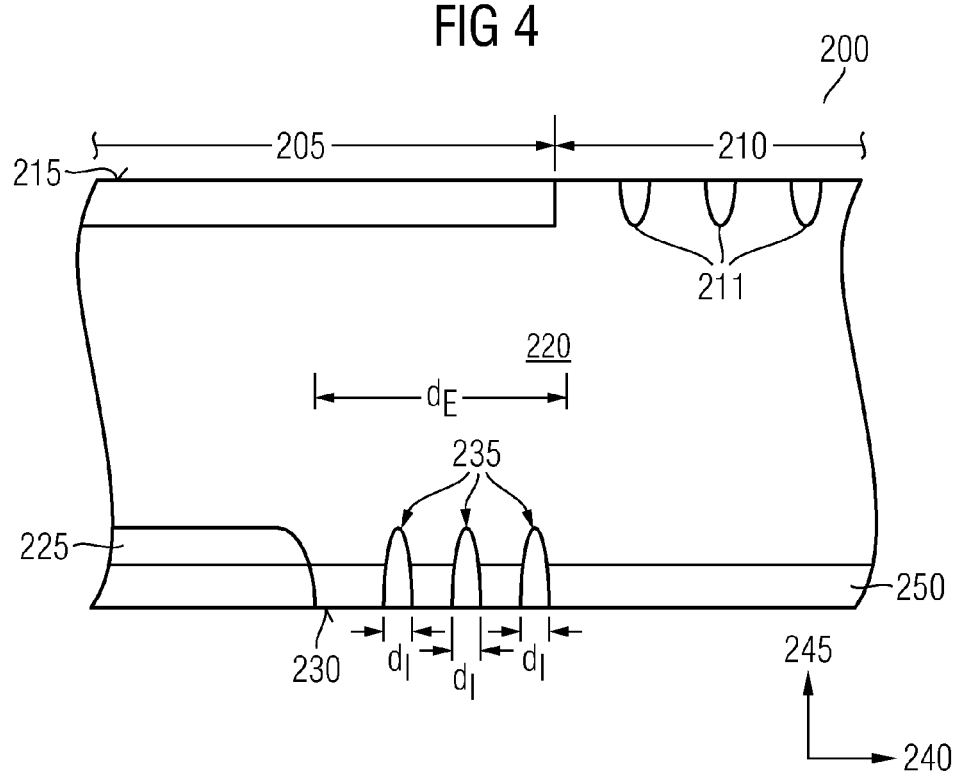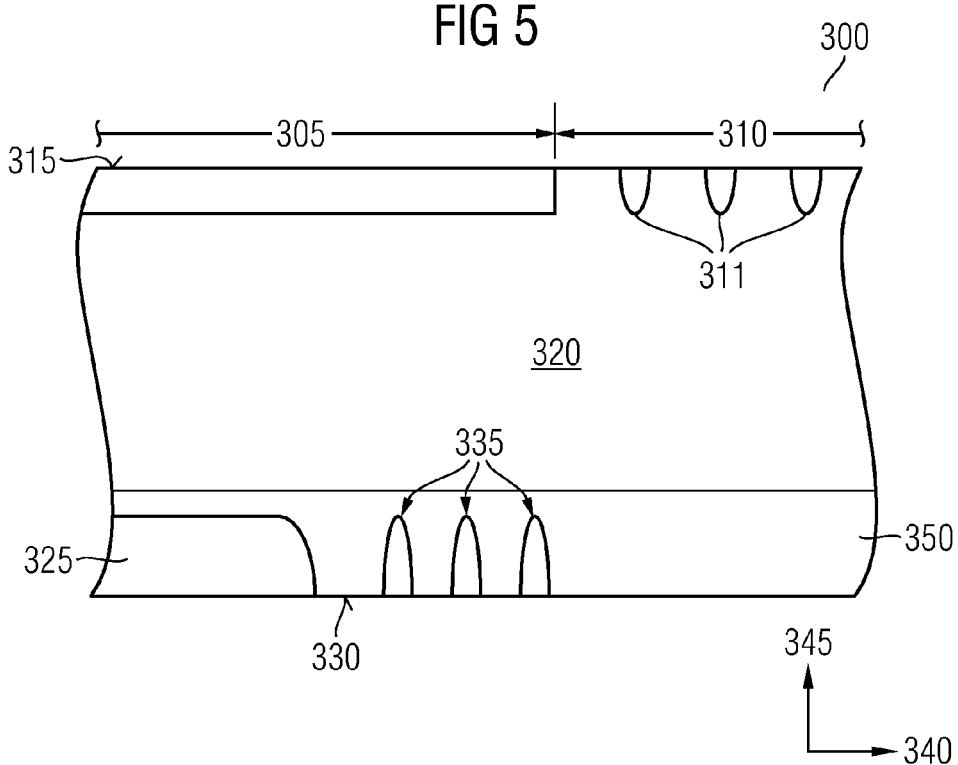

INSULATED GATE BIPOLAR TRANSISTOR

BACKGROUND

In semiconductor devices such as Insulated Gate Bipolar Transistors (IGBTs) or Silicon-Controlled Rectifiers (SCRs) switching between operation modes is accompanied by a change in the charge carrier distribution within the device. This change in the charge carrier distribution may be accompanied by such a change in the electric field distribution within the device that a current flow in short-circuit mode becomes destructive.

A need exists for a semiconductor device having improved short-circuit resistance.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 4 illustrates a schematic cross-sectional view of a semiconductor device including second regions at a second side of a drift region extending deeper into the drift region than a third region of equal conductivity type than the second regions.

FIG. 5 illustrates a schematic cross-sectional view of a semiconductor device including a third region at a second side of a drift region extending deeper into the drift region than second regions of equal conductivity type than the third region.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a semiconductor device that includes a cell area and a junction termination area at a first side of a semiconductor zone of a first conductivity type. At least one first region of a second conductivity type is formed at a second side of the semiconductor zone, the at least one first region being opposed to the cell area region. Furthermore, at least one second region of the second conductivity type is formed at the second side of the semiconductor zone, wherein the at least one second region is opposed to the cell area region and has a lateral dimension smaller than the at least one first region.

Figure 1:
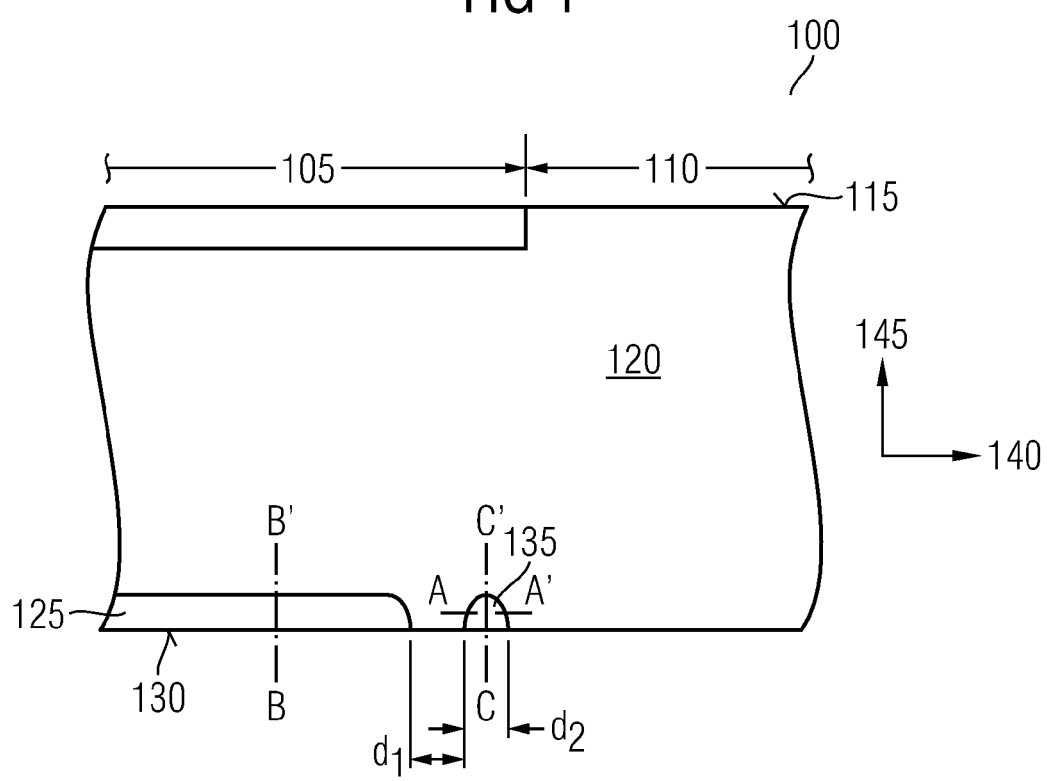
FIG. 1 illustrates a schematic cross-sectional view of a semiconductor device portion in accordance with one embodiment.

FIG. 1 illustrates a schematic cross-sectional view of a portion of a semiconductor device 100 according to one embodiment. The semiconductor device 100 includes a cell area 105 and a junction termination area 110 at a first side 115 of a semiconductor zone 120 of a first conductivity type. A first region 125 of a second conductivity type is formed at a second side 130 of the semiconductor zone 120, the first region 125 being opposed to the cell area region 105. A second region 135 of the second conductivity type is formed at the second side 130 of the semiconductor zone 120, wherein the second region 135 is opposed to the cell area region 105 and has a lateral dimension $d_2$ smaller than the corresponding lateral dimension $d_1$ of the first region 125.

A lateral direction 140 is a direction along a surface plane of the first side 115 or the second side 130. A vertical direction 145 is a direction perpendicular to a surface plane of the first side 115 or the second side 130.

The first conductivity type is different from the second conductivity type. By way of example, the first conductivity type may be an n-type and the second conductivity type may be a p-type. According to one embodiment, the first conductivity type is the p-type and the second conductivity type is the n-type.

The semiconductor device 100 may include further semiconductor regions not illustrated in FIG. 1. According to one embodiment, the semiconductor device 100 may be an IGBT. According to one embodiment, the semiconductor device 100 may be an asymmetric SCR.

In the cell area 105 a plurality of transistor cells, e.g., Field Effect Transistor (FET) cells including gate structures, may be formed. In the junction termination area 110 field plates and/or semiconductor regions such as field rings and/or variations of the lateral doping structure may be formed to adjust a curvature of equipotential lines in a reverse blocking mode of the device 100.

The semiconductor zone 120 may be a drift zone and it may determine a blocking capability of the device 100, e.g., by its thickness and dopant profile.

The first region 125 at the second side 130 may be an emitter region at a collector side of an IGBT. In a short-circuit mode of the device 100, the second region 135 may inject charge carriers into the drift zone 120 compensating a current flow of charge carriers from within the drift zone 120 to a terminal at the second side 130. Thus, a shift of a maximum electric field within the drift zone 120 from the first side 115 to the second side 130, and destructive currents such as current filaments in the area of the maximum electric field at the second side 130 may be prevented. Hence, the short-circuit resistance of the semiconductor device 100 may be improved by a suitable doping level of the first region 125.

Between the first region 125 and the junction termination area 110 a plurality of second regions 135 may be arranged. By way of example, these second regions 135 may be successively arranged along the lateral direction 140 (not illustrated in FIG. 1). A lateral dimension of the plurality of second regions 135 successively arranged along the lateral direction 140 may be equal (not illustrated in FIG. 1). According to one embodiment, a lateral dimension of the plurality of second regions 135 successively arranged along the lateral direction 140 may decrease from the first region 125 to the junction termination area 110 (not illustrated in FIG. 1). A lateral dimension of the second region 135 along the lateral direction 140 may be in a range of 1 µm to 200 µm, in one embodiment between 2 µm to 100 µm such as between 5 µm to 50 µm. At least one of these second regions 135 may also be opposed to the junction termination area 110 (not illustrated in FIG. 1).

Figure 2A:
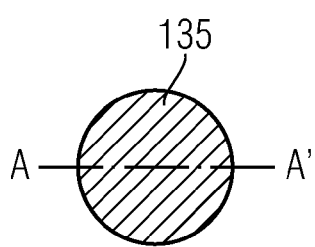
FIG. 2A illustrates a schematic plan view on the sectional plane A-A' of FIG. 1 including a second region of circular shape in accordance with one embodiment.

FIG. 2A illustrates a schematic plan view on the sectional plane A-A' of FIG. 1 including the second region 135 of circular shape in accordance with one embodiment.

Figure 2B:
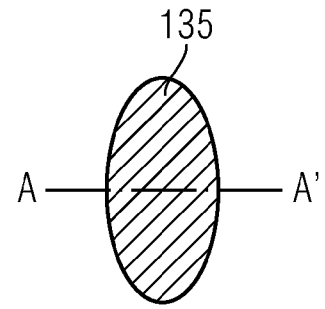
FIG. 2B illustrates a schematic plan view on the sectional plane A-A' of FIG. 1 including a second region of elliptic shape in accordance with one embodiment.

Referring to FIG. 2B illustrating a schematic plan view on the sectional plane A-A' of FIG. 1, the second region 135 may also be of elliptic shape.

Figure 2C:
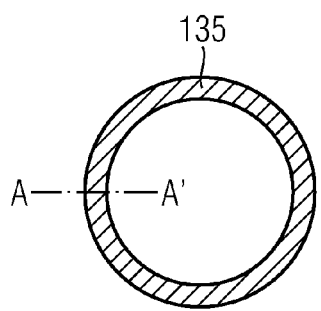
FIG. 2C illustrates a schematic plan view on the sectional plane A-A' of FIG. 1 including a second region of circular ring-shape in accordance with one embodiment.

According to one embodiment illustrated in FIG. 2C, a schematic plan view on the second region 135 along the sectional plane A-A' of FIG. 1 may be of circular ring-shape.

Figure 2D:
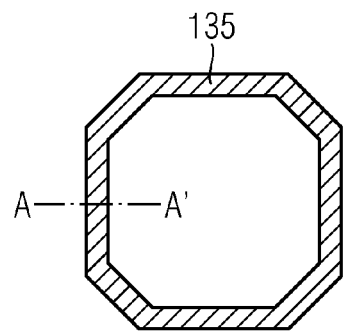
FIG. 2D illustrates a schematic plan view on the sectional plane A-A' of FIG. 1 including a second region of octagonal ring-shape in accordance with one embodiment.

According to one embodiment illustrated in FIG. 2D, the second region 135 may be of hexagonal ring-shape along the sectional plane A-A' of FIG. 1.

Figure 2E:
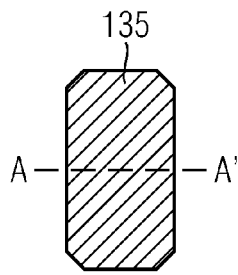
FIG. 2E illustrates a schematic plan view on the sectional plane A-A' of FIG. 1 including a second region of rectangular shape with rounded corners in accordance with one embodiment.

Referring to FIG. 2E illustrating a schematic plan view on the sectional plane A-A' of FIG. 1, the second region 135 may be of rectangular or square shape with rounded corners.

A shape of the second region 135 along the sectional plane A-A' of FIG. 1 may be of polyangular-shape, i.e., a hexagon, an octagon, a decagon.

Figure 3A:
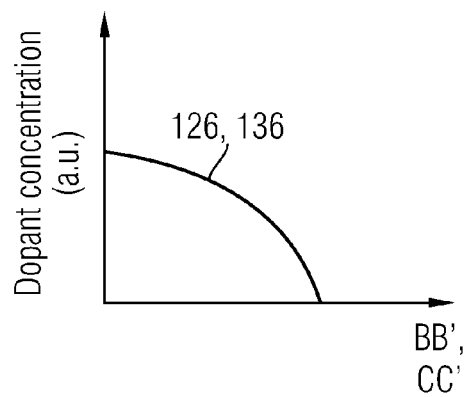
FIG. 3A is a diagram of equal dopant profiles of first and second regions along cut lines B-B' and C-C' of FIG. 1 in accordance with one embodiment.

FIG. 3A illustrates a diagram of equal dopant profiles 126, 136 of the first region 125 and the second region 135 along cut lines B-B' and C-C' along a vertical direction 145 of FIG. 1 in accordance with one embodiment. Equal dopant profiles 126, 136 for the first region 125 and the second region 135 may be provided by a same photolithography and implant of ions when forming these regions, for example.

Figure 3B:
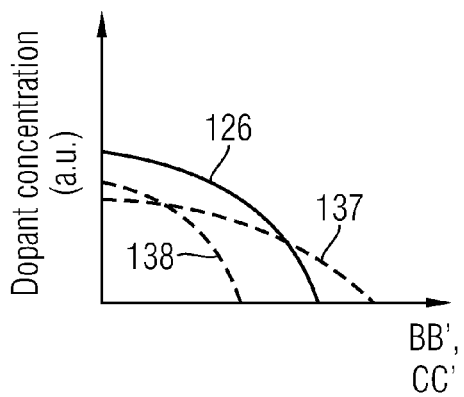
FIG. 3B is a diagram of different dopant profiles of first and second regions along cut lines B-B' and C-C' of FIG. 1 in accordance with one embodiment.

According to one embodiment illustrated in FIG. 3B, a profile of the dopant concentration 126 of the first region 125 along the vertical direction 145 into the semiconductor zone 120 differs from the profile of the dopant concentration 137 of the second region 135. The profile 137 of the dopant concentration of the second region 135 includes a maximum dopant concentration less than the corresponding maximum dopant concentration of the first region 125 and a depth of the second region 137 into the semiconductor zone 120 is larger than the corresponding depth of the first region 125 into the semiconductor zone 120.

According to one or more embodiments, the profile of the dopant concentration of the first region 125 may differ from the corresponding profile of the dopant concentration of the second region 135 by at least one of maximum dopant concentration and extension depth into the semiconductor zone 120 determined by implant dose and implant energy, for example. These profiles may also differ with regard to a dopant element, i.e., material of dopant.

As a further example of a dopant concentration profile 138 of the second region 135 illustrated in FIG. 3B, the maximum dopant concentration and the extension depth into the semiconductor zone 120 along the vertical direction 145 may be less than the corresponding profile 126 of the first region 125. Different profiles of dopant concentration between the first region 125 and the second region 135 may be provided by using different photolithography for forming the first region 125 and the second region 135, i.e., any of different implant doses, implant energies and dopant elements.

FIG. 4 illustrates a schematic cross-sectional view of a portion of an IGBT 200 in accordance with one embodiment. IGBT 200 includes a transistor cell area 205 and a junction termination area 210 including semiconductor termination regions 211 at a first side 215 of a drift zone 220 of a first conductivity type. In the transistor cell area 205 an emitter side of IGBT 200 including source, body regions and gates may be formed.

At a second side 230 of the drift zone 220, a collector side of IGBT 200 is formed. At the second side 230, an emitter region 225 of a second conductivity type different from the first conductivity type of the drift zone 220 is formed. A distance $d_E$ from a lateral edge of the emitter region 225 to a lateral edge of the transistor cell area 205 along a lateral direction 240 may be in a range of several 10% to several 100% of a diffusion length of minority charge carriers within the drift zone 220. Second regions 235 of the second conductivity type are formed at the second side 230 between the emitter region 225 and the junction termination area 210. The second regions 235 are consecutively arranged along the lateral direction 240 from the emitter region 225 to the junction termination area 210. The dopant profile of the second regions 235 along a vertical direction 245 may correspond to the dopant profile of the emitter region 225, i.e., these regions may be formed by a same implant in a same lithography step. Each of the second regions 235 may have a same lateral dimension $d_1$ along the lateral direction 240. According to one embodiment, a lateral dimension of the plurality of second regions 235 successively arranged along the lateral direction 240 may decrease from the emitter region 225 to the junction termination area 210 (not illustrated in FIG. 4). A third region 250 of the second conductivity type is formed at the second side 230 of the drift zone 220 opposed to both the transistor cell area 205 and the junction termination area 210.

A maximum dopant concentration of the third region 250 may be smaller than the maximum dopant concentration of each of the second regions 235 and of the emitter region 225. A vertical extension of the third region 250 into the drift zone 220 along the vertical direction 245 is smaller than the corresponding vertical extension of each of the second regions 235 into the drift zone 220.

The second regions 235 may be configured to inject a minor amount of charge carriers into the drift zone 220 during a conductive mode of IGBT 200, but may inject enough charge carriers in a short-circuit mode to avoid a shift of a maximum electric field along the vertical direction 245 from the first side 215 to the second side 230 of the drift zone 220.

FIG. 5 illustrates a schematic cross-sectional view of a portion of an IGBT 300 according to one embodiment. Similar to IGBT 200 illustrated in FIG. 4, IGBT 300 includes a transistor cell area 305 and a junction termination area 310 including semiconductor termination regions 311 at a first side 315 of a drift zone 320 of a first conductivity type. At a second side 330 of the drift zone 320 constituting a collector side of IGBT 300, an emitter region 325 of a second conductivity type and second regions 335 of a second conductivity type are formed. A third region 350 of the second conductivity type having a smaller maximum dopant concentration than each of the second regions 335 is formed at the second side 330. Different from the third region 250 of IGBT 200 illustrated in FIG. 4, the third region 350 has a vertical extension along the vertical direction 345 into the drift zone 320 that is larger than the corresponding vertical extension of each of the second regions 335 into the drift zone 320.

Figure 6:
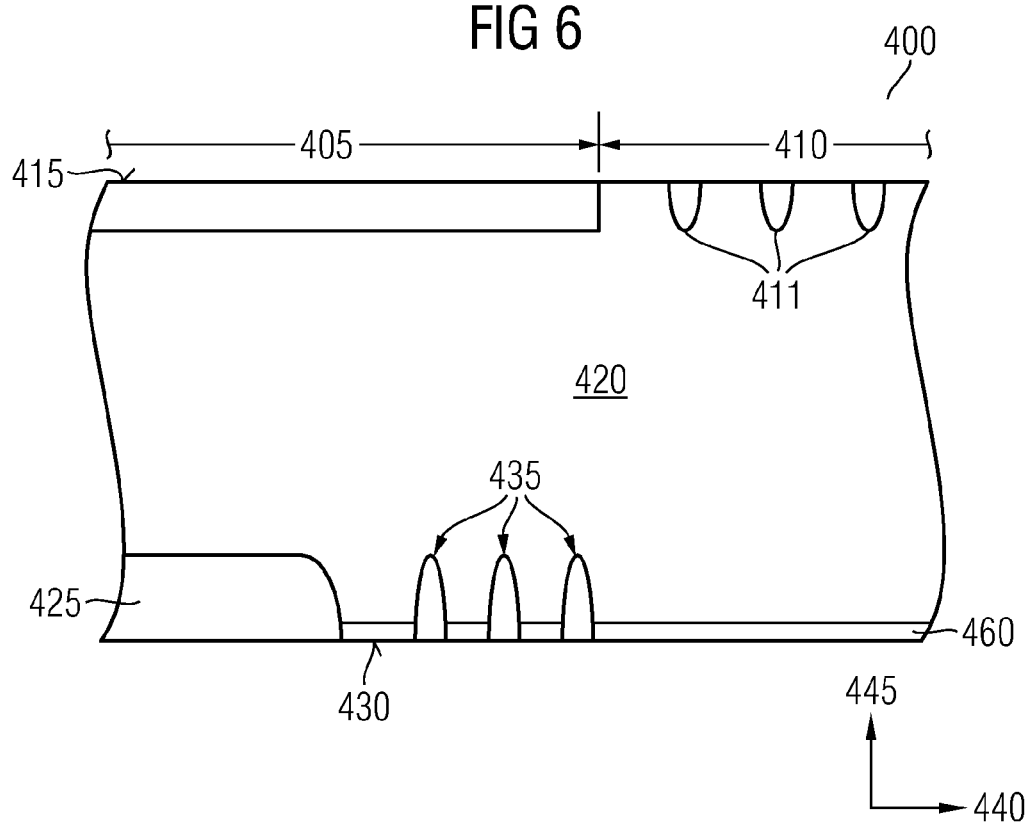
FIG. 6 illustrates a schematic cross-sectional view of a semiconductor device including second regions at a second side of a drift region extending deeper into the drift region than a fifth region of a different conductivity type than the second regions.

With regard to the schematic cross-sectional view of a portion of an IGBT 400 illustrated in FIG. 6, a transistor cell area 405, a junction termination area 410 including semiconductor termination regions 411, an emitter region 425 at a collector side of a drift zone 420 and a plurality of second regions 435 are formed similar to the corresponding elements 205, 210, 211, 225 and 235 of the embodiment illustrated in FIG. 4. In addition, a fifth region of the first conductivity type, i.e., a conductivity type different from the conductivity type of the emitter region 425, is formed at the second side 430 of IGBT 400, the fifth region being at least partly opposed to the junction termination area 410 at the first side 415 of the drift zone 425. A vertical extension of the fifth region 460 along a vertical direction 445 into the drift zone 420 is smaller than the corresponding extension of emitter region 425 into the drift zone 420. A maximum dopant concentration of each of the second regions 435 may be larger than the maximum dopant concentration of the fifth region. IGBT 400 may be a reverse-conducting IGBT.

Figure 7:
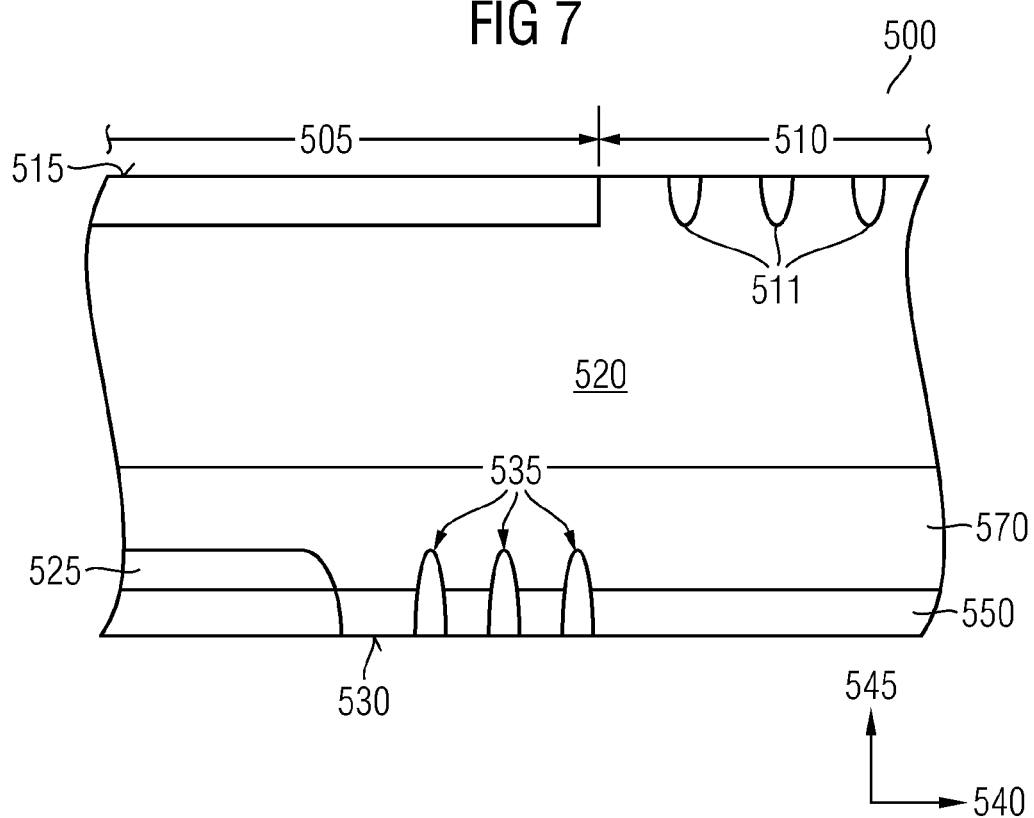
FIG. 7 illustrates a schematic cross-sectional view of a semiconductor device including second regions at a second side of a drift region extending deeper into the drift region than a third region of equal conductivity type than the second regions and a fourth region of different conductivity type than the second regions.

With regard to the schematic cross-sectional view of a portion of an IGBT 500 illustrated in FIG. 7, a transistor cell area 505, a junction termination area 510 including semiconductor termination regions 511, an emitter region 525 at a collector side of a drift zone 520 and a plurality of second regions 535 and a third region 550 are formed similar to the corresponding elements 205, 210, 211, 225, 235 and 250 of the embodiment illustrated in FIG. 4. In addition, a fourth region 570 of the first conductivity type, i.e., a conductivity type different from the conductivity type of the emitter region 525, is formed at a second side 530, i.e., a collector side, of IGBT 500. The fourth region may be a field stop zone and it may extend deeper into the drift zone 520 than the emitter region 525. The field stop zone may be formed by implant of H$^+$ ions with a subsequent annealing such as annealing at temperatures within a range of 350° C. to 420° C., or by diffusion of P or Se, for example.

Figure 8A:
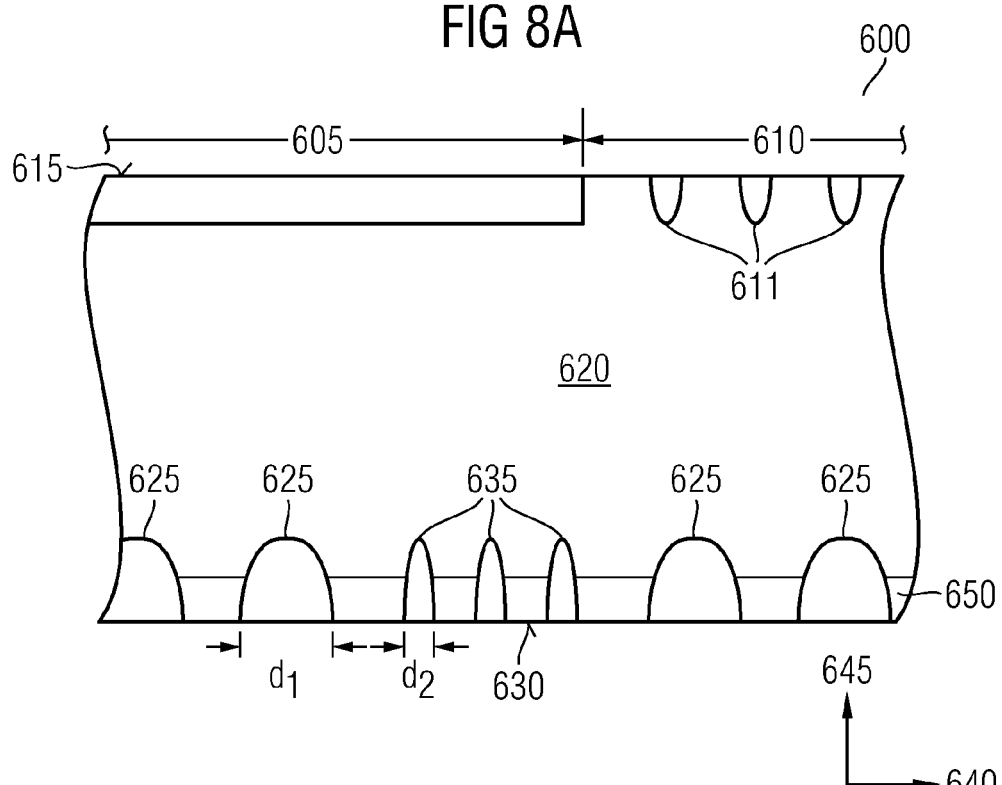
FIG. 8A illustrates a schematic cross-sectional view of a semiconductor device including a plurality of first and second regions at a second side of a drift region.

FIG. 8A illustrates a schematic cross-sectional view of a portion of an IGBT 600 according to one embodiment. A transistor cell area 605 is formed at a first side 615 of a drift zone 620 of a first conductivity type. At a second side 630 of the drift zone 620 a plurality of emitter regions 625 of a second conductivity type different from the first conductivity type are formed. In addition to the emitter regions 625, a plurality of second regions 635 of the second conductivity type are formed at the second side 630 of the drift zone 620. A lateral dimension $d_2$ of each of each of the second regions 635 along the lateral direction 640 is smaller than a corresponding lateral dimension $d_1$ of each of the emitter regions 625. In addition to the emitter regions 625 and the second regions 635, a third region 650 of the second conductivity type is formed at the second side 630 of the drift zone 620. A maximum dopant concentration within the third region 650 is smaller than a maximum dopant concentration within each of the emitter regions 625. Further second regions 635 may be arranged in a transition region between the transistor cell area 605 and a junction termination area (not illustrated in FIG. 8A).

Figure 8B:
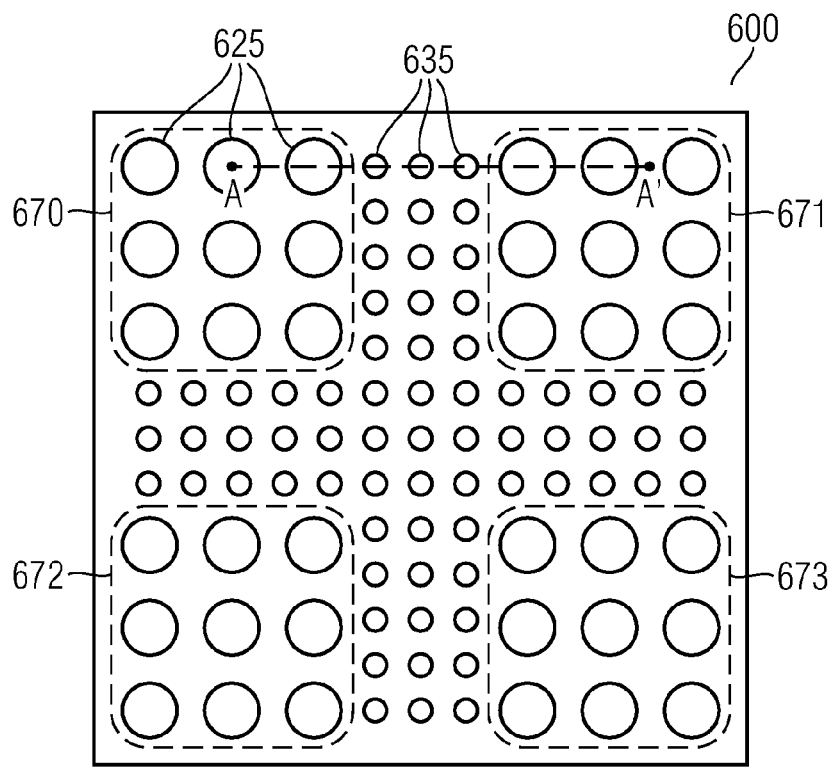
FIG. 8B illustrates a schematic plan view on a substrate portion of the IGBT of FIG. 8A.

FIG. 8B illustrates a schematic plan view on IGBT 600 of FIG. 8A. The cross-sectional view illustrated in FIG. 8A is taken along intersection line A-A'. The plurality of emitter regions 625 are arranged in four areas 670, 671, 672 and 673. In a space between these areas 670, 671, 672 and 673, the plurality of second regions 635 are arranged. A variety of different arrangements of emitter regions 625 and second regions 635 may be provided and the specific arrangement illustrated in FIG. 8B is merely an example of positioning the emitter regions 625 and the second regions 635 having different lateral dimensions.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An insulated gate bipolar transistor, comprising:
 a transistor cell area including source, body regions, and gates and a junction termination area at a first side of a semiconductor zone of a first conductivity type;
 an emitter region of a second conductivity type at a second side of the semiconductor zone, the emitter region being opposed to the cell area region;
 at least one second region of the second conductivity type at the second side of the semiconductor zone, wherein the at least one second region is opposed to and covered by the cell area region and each of the at least one second region is disposed at a lateral distance from the emitter region and has a lateral dimension smaller than the emitter region, and wherein the at least one second region is configured to inject charge carriers into the semiconductor zone via a terminal at the second side; and
 a third region of the second conductivity type at the second side of the semiconductor zone, the third region being arranged in an area including at least part of both the emitter region and the at least one second region, and wherein a maximum dopant concentration of the third region is smaller than the maximum dopant concentration of the emitter region,
 wherein the at least one second region is arranged between the emitter region and the junction termination area; and wherein each of the emitter region, the at least one second region and the third region extend from a common surface at the second side into the semiconductor zone.

2. The insulated gate bipolar transistor of claim 1, wherein a material of dopant and a dopant profile of the at least one second region corresponds to the material of dopant and the dopant profile of the emitter region, respectively.

3. The insulated gate bipolar transistor of claim 1, wherein the at least one second region includes a plurality of second regions successively arranged in a direction from the emitter region to the junction termination area.

4. The insulated gate bipolar transistor of claim 1, wherein a lateral dimension of the at least one second region along a direction from the emitter region to the junction termination area is in a range of 2 μm to 100 μm.

5. The insulated gate bipolar transistor of claim 1, further comprising:
a fourth region of the first conductivity type at the second side of the semiconductor zone, a vertical distance of the fourth region to the first side being smaller than the corresponding vertical distance of the emitter region to the first side.

6. An insulated gate bipolar transistor, comprising:
a transistor cell area including source, body regions, and gates and a junction termination area at a first side of a semiconductor zone of a first conductivity type;
an emitter region of a second conductivity type at a second side of the semiconductor zone, the emitter region being opposed to the cell area region;
at least one second region of the second conductivity type at the second side of the semiconductor zone, wherein the at least one second region is opposed to and covered by the cell area region and each of the at least one second region is disposed at a lateral distance from the emitter region and has a lateral dimension smaller than the emitter region, and wherein the at least one second region is configured to inject charge carriers into the semiconductor zone via a terminal at the second side; and
a fifth region of the first conductivity type at the second side of the semiconductor zone, the fifth region being at least partly opposed to the junction termination area,
wherein the at least one second region is arranged between the emitter region and the junction termination area; and
wherein a vertical extension of the fifth region along a vertical direction into the semiconductor zone is smaller than the corresponding extension of the emitter region into the semiconductor zone.

7. The insulated gate bipolar transistor of claim 6, wherein the at least one second region includes a plurality of second regions successively arranged in a direction from the emitter region to the junction termination area.

* * * * *